(12) United States Patent
Adachi et al.

(10) Patent No.: US 6,210,997 B1
(45) Date of Patent: *Apr. 3, 2001

(54) SEMICONDUCTOR DEVICE AND METHOD FOR MANUFACTURING THE SAME

(75) Inventors: Hiroki Adachi; Akira Takenouchi; Takeshi Fukada; Hiroshi Uehara; Yasuhiko Takemura, all of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/362,040

(22) Filed: Jul. 28, 1999

Related U.S. Application Data

(62) Division of application No. 08/768,465, filed on Dec. 18, 1996, now Pat. No. 5,966,594, which is a division of application No. 08/280,461, filed on Jul. 26, 1994, now Pat. No. 5,663,077.

(30) Foreign Application Priority Data

Jul. 27, 1993 (JP) .................................................... 5-204773
Aug. 2, 1993 (JP) .................................................... 5-235463

(51) Int. Cl.⁷ .................................................. H01L 21/336
(52) U.S. Cl. ........................ 438/151; 438/166; 438/591; 438/762
(58) Field of Search ................................... 438/151, 158, 438/591, 166, 530, 762; 148/DIG. 1, DIG. 3, DIG. 4, DIG. 16

(56) References Cited

U.S. PATENT DOCUMENTS 4,675,978   6/1987   Swartz ................................... 437/21

(List continued on next page.)

FOREIGN PATENT DOCUMENTS

| | | |
|---|---|---|
| 48-30379   | 4/1973  | (JP) . |
| 50-62587   | 5/1975  | (JP) . |
| 53-265584  | 3/1978  | (JP) . |
| 57-194518  | 11/1982 | (JP) . |
| 59-075670  | 4/1984  | (JP) . |
| 59-087821  | 5/1984  | (JP) . |
| 62-045129  | 2/1987  | (JP) . |
| 63-133673  | 6/1988  | (JP) . |
| 64-035959  | 2/1989  | (JP) . |
| 01-128471  | 5/1989  | (JP) . |
| 1-283872   | 11/1989 | (JP) . |
| 2-140915   | 5/1990  | (JP) . |
| 3-6865     | 1/1991  | (JP) . |
| 3-280420   | 12/1991 | (JP) . |
| 3-289140   | 12/1991 | (JP) . |
| 4-022127   | 1/1992  | (JP) . |
| 4-102375   | 4/1992  | (JP) . |
| 4-152624   | 5/1992  | (JP) . |
| 4-188771   | 7/1992  | (JP) . |
| 4-360580   | 12/1992 | (JP) . |

OTHER PUBLICATIONS

*Electronic Materials Series, VLSI Thin Film Technique*, by Sato et al., Publisher: Maruzen Co., Published on Sep. 30, 1986, pp. 62–64 (translated).

(List continued on next page.)

Primary Examiner—Kevin M. Picardat
(74) Attorney, Agent, or Firm—Eric J. Robinson; Nixon Peabody LLP

(57) ABSTRACT

A method for manufacturing a semiconductor device comprises the steps of forming a semiconductor film on a substrate, oxidizing a surface of said semiconductor film in an oxidizing atmosphere with said semiconductor film heated or irradiated with light, and further depositing an oxide film on the oxidized surface of the semiconductor film by PVD or CVD. The first oxide film has a good interface condition with the semiconductor film and a characteristics of an insulated gate field effect transistor can be improved if the first oxide-film and the second oxide film are used as a gate insulating film.

29 Claims, 12 Drawing Sheets

U.S. PATENT DOCUMENTS

| | | | |
|---|---|---|---|
| 4,868,014 | 9/1989 | Kanai et al. | 427/248.1 |
| 4,885,258 | 12/1989 | Ishihara et al. | 437/40 |
| 5,028,560 | 7/1991 | Tsukamoto et al. | 437/239 |
| 5,147,826 | 9/1992 | Liu | 437/233 |
| 5,275,851 | 1/1994 | Fonash et al. . | |
| 5,294,571 | 3/1994 | Fujishiro et al. | 437/239 |
| 5,298,436 | 3/1994 | Radosevich et al. | 437/233 |
| 5,322,807 | 6/1994 | Chen et al. | 437/41 TFT |
| 5,372,958 | 12/1994 | Miyasaka | 437/40 |
| 5,403,772 | 4/1995 | Zhang et al. . | |
| 5,412,493 | 5/1995 | Kunii et al. | 437/41 TFT |
| 5,422,287 | 6/1995 | So | 437/21 |
| 5,426,064 | 6/1995 | Zhang et al. . | |
| 5,481,121 | 1/1996 | Zhang et al. . | |
| 5,488,000 | 1/1996 | Zhang et al. . | |
| 5,492,843 | 2/1996 | Adachi et al. . | |
| 5,501,989 | 3/1996 | Takayama et al. . | |
| 5,508,533 | 4/1996 | Takemura . | |
| 5,529,937 | 6/1996 | Zhang et al. . | |
| 5,534,716 | 7/1996 | Takemura . | |
| 5,543,352 | 8/1996 | Ohtani et al. . | |
| 5,563,426 | 10/1996 | Zhang et al. . | |
| 5,569,610 | 10/1996 | Zhang et al. . | |
| 5,569,936 | 10/1996 | Zhang et al. . | |
| 5,574,291 | 11/1996 | Dodabalapur et al. | 257/40 |
| 5,580,792 | 12/1996 | Zhang et al. . | |
| 5,585,291 | 12/1996 | Ohtani et al. . | |
| 5,589,694 | 12/1996 | Takayama et al. . | |
| 5,595,923 | 1/1997 | Zhang et al. . | |
| 5,595,944 | 1/1997 | Zhang et al. . | |
| 5,604,360 | 2/1997 | Zhang et al. . | |
| 5,605,846 | 2/1997 | Ohtani et al. . | |
| 5,606,179 | 2/1997 | Yamazaki et al. . | |
| 5,608,232 | 3/1997 | Yamazaki et al. . | |
| 5,612,250 | 3/1997 | Ohtani et al. . | |
| 5,614,426 | 3/1997 | Funada et al. . | |
| 5,614,733 | 3/1997 | Zhang et al. . | |
| 5,616,506 | 4/1997 | Takemura . | |
| 5,620,910 | 4/1997 | Teramoto | 438/151 |
| 5,621,224 | 4/1997 | Yamazaki et al. . | |
| 5,624,851 | 4/1997 | Takayama et al. . | |
| 5,637,515 | 6/1997 | Takemura . | |
| 5,639,698 | 6/1997 | Yamazaki et al. . | |
| 5,643,826 | 7/1997 | Ohtani et al. . | |
| 5,646,424 | 7/1997 | Zhang et al. . | |
| 5,654,203 | 8/1997 | Ohtani et al. . | |
| 5,656,825 | 8/1997 | Kusumoto et al. . | |
| 5,663,077 * | 9/1997 | Adachi et al. | 438/151 |
| 5,677,549 | 10/1997 | Takayama et al. . | |
| 5,696,386 | 12/1997 | Yamazaki . | |
| 5,696,388 | 12/1997 | Funada et al. . | |
| 5,700,333 | 12/1997 | Yamazaki et al. . | |
| 5,705,829 | 1/1998 | Miyanagi et al. . | |
| 5,712,191 | 1/1998 | Nakajima et al. . | |
| 5,739,549 | 4/1998 | Takemura et al. | 257/59 |
| 5,753,542 | 5/1998 | Yamazaki et al. | 438/162 |
| 5,966,594 * | 10/1999 | Adachi et al. | 438/151 |

OTHER PUBLICATIONS

R.J. Nemanich et al., "Structure and Growth of the Interfact of Pd on –SiH", The American Physical Society—Physical Review, vol. 22, No. 12, pp. 6828–6831, Jun. 1981.

M.J. Thompson et al., "Silicide Formation in Pd – –Si:H Schottky Barrierss", Appl. Phys. Lett. , vol. 38, No. 3, pp. 274–276, Aug. 1981.

R.J. Nemanich et al., "Initial Phase Formation at the Interface of Ni, Pd, or Pt and Si", Mat. Res. Soc. Symp. Proc., vol. 25, 1984.

VLSI Process Data Handbook, published Apr. 15, 1992.

S. Wolf, "Silicon Processing for the VLSI Era, vol. 1" Lattice Press, 1986, pp. 57–58, Jan., 1986.

S. Wolf, "Silicon Processing for the VLSI Era," Lattice Press, California, Oct., 1995.

J. Nulman et al, "Rapid Thermal Processing of Thin Gate Dielectrics," IEEE Electron Device Letters, V. 6, No. 5, 205–7, May, 1985.

United States Defensive Publication T954,009 (Malin), Jan., 1977.

Stanley Wolf Ph.D., "*Silicon Processing For The VLSI ERA,*" pp. 502–504, 1995.

Science Forum Co. Ltd., *Ultra LSI Process Data Handbook,* 1982, 124–126.

* cited by examiner-

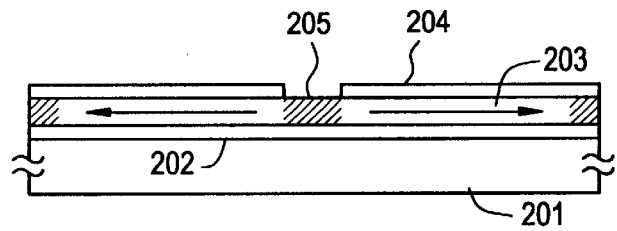
FIG.2A
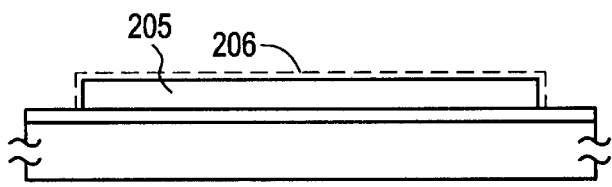
FIG.2B
FIG.2C
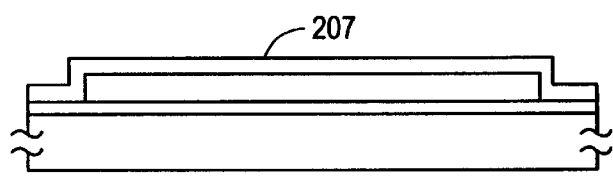
FIG.2D
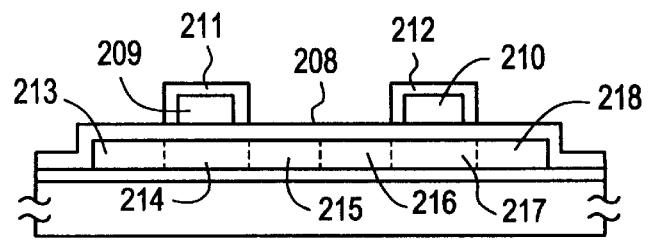
FIG.2E
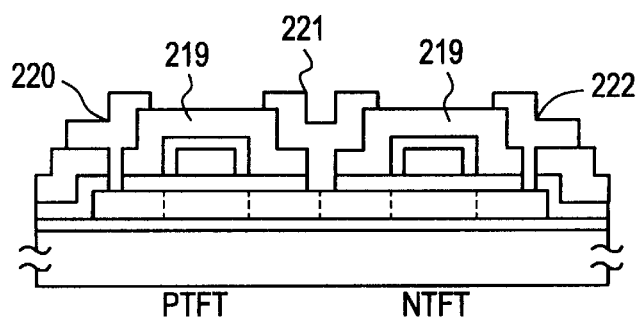

SEMICONDUCTOR DEVICE AND METHOD FOR MANUFACTURING THE SAME

This application is a Division of application Ser. No. 08/768,465 filed Dec. 18, 1996, now U.S. Pat. No. 5,966,594; which itself is a Division of Ser. No. 08/280,461, filed Jul. 26, 1994, now U.S. Pat. No. 5,663,077.

FIELD OF THE INVENTION

The present invention relates to a semiconductor device such as a thin film transistor (TFT) or a thin film diode (TFD), or a thin film integrated circuit (IC) to which TFT or TFD is applied, and in particular, a thin film integrated circuit (IC) for an active-matrix addressed (active matrix) liquid crystal display device, having an insulated gate structure comprising a semiconductor film provided on an insulating substrate such as a glass substrate, or on an insulating coating formed on any type of substrate. The present invention also relates to a process for fabricating the same.

DESCRIPTION OF THE PRIOR ART

Semiconductor devices comprising TFTs on an insulating substrate (such as a glass substrate) developed heretofore include an active matrix-addressed liquid crystal display device using the TFTs for driving the matrices, an image sensor, and a three-dimensional IC.

The TFTs utilized in those devices generally employ a thin film silicon semiconductor. Thin film semiconductors can be roughly classified into two; one is a type comprising amorphous silicon semiconductor (a—Si), and the other is a type comprising crystalline silicon semiconductors. Amorphous silicon semiconductors are most prevailing, because they can be fabricated relatively easily by a vapor phase process at a low temperature, and because they can be readily obtained by mass production. The physical properties thereof, such as electric conductivity, however, are still inferior to those of a crystalline silicon semiconductor. Thus, to implement devices operating at an even higher speed, it has been keenly demanded to establish a process for fabricating TFTs comprising crystalline silicon semiconductors. Known crystalline semiconductors include polycrystalline silicon, microcrystalline silicon, amorphous silicon partly comprising crystalline components, and semiamorphous silicon which exhibits an intermediate state between crystalline silicon and amorphous silicon.

In case of fabricating an insulated gate structure using the silicon films enumerated above, an insulating film having excellent boundary characteristics must be fabricated by any means on the surface of the silicon film. For instance, a gate insulated film can be formed by thermal oxidation if a quartz substrate or any substrate resistant to high temperature is used. However, a quartz substrate is expensive, and is not suitable for large area substrates due to its too high a melting point. Accordingly, the use of other inexpensive glass materials (such as a Corning No. 7059 glass) for the substrate is preferred because of its low melting point and its applicability to mass production. Those lower cost glass substrate materials, however, do not resist to a high temperature process for fabricating a thermal oxidation film. Thus, the insulating film is formed on those inexpensive glass substrates at lower temperatures by means of a physical vapor deposition (PVD) such as sputtering, or a chemical vapor deposition (CVD) such as plasma assisted CVD or photo CVD.

The insulating films formed by PVD or CVD process, however, suffer pinholes and inferior interface characteristics. Thus, the TFTs formed from these films yield problematic low field mobility and low sub-threshold characteristics (the S value), or a large leak current in gate electrode, a severe degradation, and a low production yield. In particular, these characteristics of a gate insulating film has not been found a problem in a TFT using amorphous silicon having low mobility, however, in a TFT using a silicon film having high mobility, the characteristics of the gate insulating film are found more important than those of the silicon film itself.

SUMMARY OF THE INVENTION

An object of the present invention is to provide a means for solving the aforementioned problems, and to provide an oxide film on the semiconductor layer formed on an insulating substrate. In particular, the present invention provides a process for fabricating a gate insulating film as well as a structure of a gate insulating film using a crystalline silicon film for a TFT improved in device characteristics, reliability, and production yield, so long as the conditions do not affect the substrate materials.

Another object of the present invention is to provide, in addition to the active layer of a semiconductor device, a highly crystalline semiconductor layer.

The present invention is characterized in that it comprises forming a thin silicon oxide film on the surface of an island-like crystalline silicon film by irradiating an intense light to the semiconductor material (optically annealing) at a wavelength not influencing the substrate material under an oxidizing atmosphere such as of oxygen, nitrogen oxide, and ozone. Otherwise, the thin silicon oxide film (referred to hereinafter as "thermal oxide film", inclusive of the silicon oxide film obtained by irradiating an intense light) is formed by thermally annealing the island-like crystalline silicon film at a temperature not influencing the substrate material. In the present invention, the step of forming a thin silicon oxide film is followed by the step of forming a thick silicon oxide film covering the thin silicon oxide film by means of various types of known CVD processes to provide a gate insulating film of a desired thickness.

In particular, the silicon oxide film is obtained by subjecting an organic silane such as tetraethoxysilane (TEOS) as the silicon source together with an oxidizing agent such as oxygen, ozone, or nitrogen oxide, to a CVD process to form silicon oxide. The CVD process specifically refers to a reduced pressure CVD, a normal pressure CVD, a photo CVD, plasma CVD, and a combination thereof.

A silicon oxide film with still stable characteristics can be obtained by forming a silicon oxide film by CVD, and then photo annealing the silicon oxide film again using a visible light or a near infrared light or thermally annealing at a temperature in the range of from 400 to 700° C., under an atmosphere of a gaseous compound of oxygen and nitrogen (e.g., $N_2O$), or a mixed gas atmosphere (e.g., a 4:1 mixture of nitrogen and oxygen).

Furthermore, the inventors have discovered that a concentration of electron traps is undesirably high when the silicon oxide film is formed by an organic silane through CVD and the inventor considered that the traps are related to Si—OH bondings. In accordance with another aspect of the invention, the silicon oxide formed from an organic silane is annealed with a nitrogen containing atmosphere, for example, $NH_3$, $N_2H_4$, $N_2$ and $N_2O$ at a temperature from 400–850° C., thereby, breaking the Si—OH bondings and improving the reliability of the gate insulated structure.

In the process according to the present invention, light is preferably irradiated for a relatively short duration of from about 10 to 1,000 seconds to elevate the surface temperature of the silicon film in the temperature range of from 900 to 1,200° C. The light is irradiated to the silicon film, preferably, at a wavelength absorbed by the silicon film and substantially not absorbed by the substrate. More specifically, a light of a wavelength falling in the range for a near infrared region to the visible light region is preferred, and a light having a wavelength of from 0.5 $\mu$m to 4 $\mu$m (e.g., an infrared light having a peak at a wavelength of 1.3 $\mu$m) is more preferred.

In the present invention described above, the thermal annealing is preferably effected at such a temperature that would not unfavorably influence the substrate as to form warping and shrinking thereon. More specifically, the thermal annealing is effected in the middle temperature range of from 400 to 700° C., and more preferably, in the range of from 500 to 600° C. In general, the thermal annealing is performed at a temperature not higher than the deformation temperature of the substrate, however, the strain energy accumulated inside the substrate can be released to sufficiently reduce the distortion by thermally treating the substrate prior to the thermal annealing. Accordingly, the thermal annealing in this case can be applied at a temperature not lower than the deformation temperature.

The crystalline silicon film for use in the present invention can be fabricated by using a laser or an intense light equivalent thereto to crystallize a non-crystalline silicon film, or by using a thermal annealing.

In accordance with another aspect of the invention, a thermal annealing at a temperature lower than the ordinary crystallization temperature for solid phase growth can be effected using nickel or another metal element. The elements for accelerating the crystallization include the Group VIII elements of the periodic table, i.e., iron (Fe), cobalt (Co), nickel (Ni), ruthenium (Ru), rhodium (Rh), palladium (Pd), osmium (Os), iridium (Ir), and platinum (Pt). Also included are the transition elements having the 3d electrons, i.e., scandium (Sc), titanium (Ti), vanadium (V), chromium (Cr), manganese (Mn), copper (Cu), and zinc (Zn). Further included are gold (Au) and silver (Ag) whose effect on the crystallization is experimentally observed. The most effective among the elements enumerated above is nickel, and the operation of a TFT based on the crystalline silicon film using the effect is verified.

A silicon film containing the elements above as an additive is observed to grow into acicular (needle-like) crystals. However, the crystal growth occurs not globally on the surface, and amorphous regions or regions of low crystallinity having a crystallinity equivalent to that of the amorphous region are left between the crystals. The silicon film containing any of the metal elements above grow into acicular crystals having a width of from 0.5 to 2 times the thickness of the film. Moreover, the crystal grows less along the width direction; i.e. in the direction toward the sides of the crystal, not along the crystallographic <111> orientation. Accordingly, the deterioration in characteristics of the silicon film of this type has been found a serious problem when used in a TFT, because the amorphous region does not undergo crystallization even after an annealing effected for a long duration of time.

In the present invention, an intense light is irradiated to an amorphous silicon film. In such a case, however, a part of the optical energy is utilized for the crystal growth to accelerate the film growth along the direction toward the sides of the crystals. Accordingly, a dense crystalline silicon film can be obtained.

When using a ultraviolet light (UV) having a shorter wavelength than a visible light and the like, not only the silicon film but also the substrate material absorbs the light. Accordingly, the optimal duration of irradiating the light becomes shorter. For instance, the duration of irradiating a light 248 nm in wavelength is preferably not longer than 1 $\mu$sec. If the light is irradiated for a still longer duration, the substrate undergoes deformation due to the light absorbed at an excessively large quantity. Thus, in case the light is irradiated for an extremely short period of time, the quantity of light must be selected as such which instantaneously elevates the surface of the silicon film to a temperature higher than 1,000° C. Since the temperature is raised and lowered instantaneously, the oxidation can not proceed sufficiently by a single irradiation. Accordingly, the light must be irradiated for a plurality of times. The thickness of the oxide film which results by the repeated irradiation depends on the irradiation times.

In case irradiation is effected for a short period of time using UV as the light source, a laser operated in pulses, such as the excimer laser, is most preferred. An excimer laser has a pulse width of 100 nsec or less.

In the present invention, the substrate temperature may be elevated to a maximum of value of 600° C., and preferably, to 400° C.

The insulating film that is deposited by PVD or CVD after annealing the silicon substrate by either irradiating an intense light or annealing at a medium temperature is generally a silicon oxide film, however, it may be a silicon nitride film or a silicon oxynitride film. Furthermore, the irradiation of an intense light and the thermal annealing can be repeated for a plurality of times.

The thermal oxide film which is obtained by either irradiating an intense light or by annealing at a medium temperature is generally provided at a thickness of from 20 to 200 Å, and representatively, at a thickness of 100 Å. It differs from a known film obtained by PVD or CVD, and is an extremely dense film of a uniform thickness free from pinholes. Furthermore, it exhibits an ideal boundary with a silicon film. A thick insulating film, representatively, a silicon oxide film, is deposited on the thermal oxide film. Thus, a leak current due to pinholes is further prevented from occurring, and the production yield is still improved.

Furthermore, since a favorable interface is realized between the thermal oxide film and the silicon film, the use of the thermal oxide film further improves the characteristic values and the reliability of the TFT. In a prior art process for fabricating a TFT as illustrated in FIG. 4A, in particular, cavities tend to form on the edges of a silicon film upon fabricating an island-like silicon film due to over etching. This is found to occur most frequently in case a soft base film having a high etching rate is used. A prior art PVD or CVD could not bury the cavities, and leak current was found to generate frequently by the presence of cracks and the like (FIG. 4B).

In contrast to the prior art process described above, the formation of cracks is of practically no problem for the semiconductor device of the present invention because a thermal oxide film of a uniform thickness and free from defects such as pinholes is formed around the silicon film (FIG. 4C).

Previously, an oxide film of such a high quality was only obtained by a thermal oxidation at high temperatures. However, this requirement greatly limited the use of substrates. It can be seen that the present invention is free of such limitations concerning the heat resistance of the substrate.

Thus, the present invention provides a gate insulating film having a superior quality and reliability by forming a pinhole-free thin and dense thermal oxide film of uniform thickness on the surface of an active layer, either by irradiating an intense light at a wavelength not absorbed by the substrate to the island-like silicon film provided as the active layer of the TFT or by annealing the active layer in an oxidizing atmosphere at a temperature at which no warping or shrinkage may occur on the substrate, and further superposing, on the thin thermal oxide film, a thick silicon oxide film by CVD using TEOS and an oxidizing gas such as oxygen.

Conventionally, an oxide film of such a superior quality above has been obtained by thermal annealing at high temperatures. Accordingly, a great limitation had been posed on concerning the heat resistance. In the process and device according to the present invention, however, there is no limitation with respect to the heat resistance of the substrate material. Thus, various types of glass materials are applicable for the substrate, and great effect is found in case a material having a deformation temperature in the range of from 550 to 700° C. is used. It can be seen that the present invention is greatly contributory to the industry.

BRIEF DESCRIPTION OF THE DRAWINGS

The foregoing features and other features will be described in more detail with reference to the attached drawings in which:

FIGS. 2A–2E are cross sectional views showing a manufacturing process of a semiconductor device in accordance with a first example of the invention;

DESCRIPTION OF THE PREFERRED EMBODIMENTS OF THE INVENTION

EXAMPLE 1

The present example relates to a circuit comprising a P-channel TFT (referred to simply hereinafter as a "PTFT") using a crystalline silicon film formed on a glass substrate and an N-channel TFT (referred to singly hereinafter as an "NTFT") combined in a complementary structure. The constitution of the present example can be used as a switching element of pixel electrodes or a peripheral driver circuit of active-type liquid crystal display device, as well as in image sensors and integrated circuits.

Referring to the step sequential-structures shown in FIGS. 1A–1D, the process for fabricating the circuit of the present invention is described below. A 2000 Å thick film of silicon oxide was deposited by sputtering as a base film 102 on a Corning 7059 glass substrate 101. The substrate is preferably subjected, either before or after depositing the base film, to a step comprising annealing at a temperature higher than the deformation temperature, then gradually lowering the temperature to a temperature below the deformation point at a cooling rate of from 0.1 to 1.0° C./minute, and again elevating the temperature (inclusive of the oxidation step according to the present invention using a light irradiation or thermal annealing). In this manner, the substrate can be prevented from shrinking to facilitate the mask-aligning step. In case of using a Corning 7059 substrate, it is preferably annealed for 1 to 4 hours at a temperature in the range of from 620 to 660° C., gradually cooled at a rate of from 0.1 to 1.0° C./minute, preferably, at a rate of from 0.1 to 0.3° C./minute,.and taking out the substrate after the temperature thereof is lowered to a range of from 450 to 590° C.

Then, a film of an intrinsic (I-type) amorphous silicon film was deposited by plasma-assisted CVD (hereinafter simply referred to sometimes as "plasma CVD") to a thickness of from 500 to 1,500 Å, for example, 1,000 Å. The amorphous silicon film thus deposited was annealed for 48 hours at 600° C. under a nitrogen inert gas atmosphere at the atmospheric pressure for crystallization. The silicon film thus obtained was then patterned to island-like silicon film portions 103 from 10 to 1,000 μm in size to obtain the active layer of the TFT.

Figure 1A:
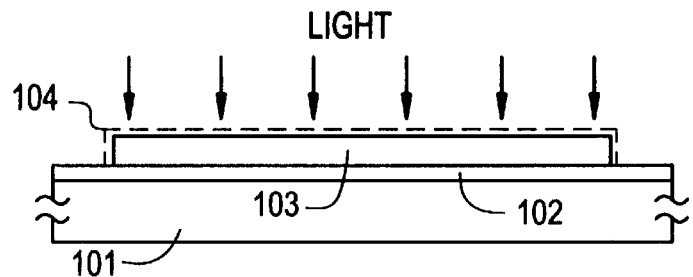
FIGS. 1A–1D are cross sectional views showing a manufacturing process of a semiconductor device in accordance with a first example of the invention.

Then, an infrared light having a peak in the wavelength range of from 0.5 to 4 μm, specifically in this case, in the wavelength of from 0.8 to 1.4 μm, was irradiated under a gaseous oxygen atmosphere for a duration of from 30 to 180 seconds to form a silicon oxide film 104 on the surface of the active layer 103 (FIG. 1A). It is also possible to add from 0.1 to 10% of hydrogen chloride (HCl) into the atmosphere.

The infrared radiation was irradiated using a halogen lamp as the light source. The intensity of the infrared light was controlled as such that the temperature measured on a monitoring single crystal silicon wafer may fall in the range of from 900 to 1,200° C. More specifically, the temperature of a thermocouple buried in the silicon wafer was monitored, and the measured value was fed back to the light source of the infrared radiation. In the present example, the temperature was raised and lowered according to a scheme illustrated in FIG. 3A or FIG. 3B. The heating rate was constant in the range of from 50 to 200° C./second, while the cooling was left to open air so that the temperature may decrease at a rate in the range of from 20 to 100° C./second.

Figure 3A:
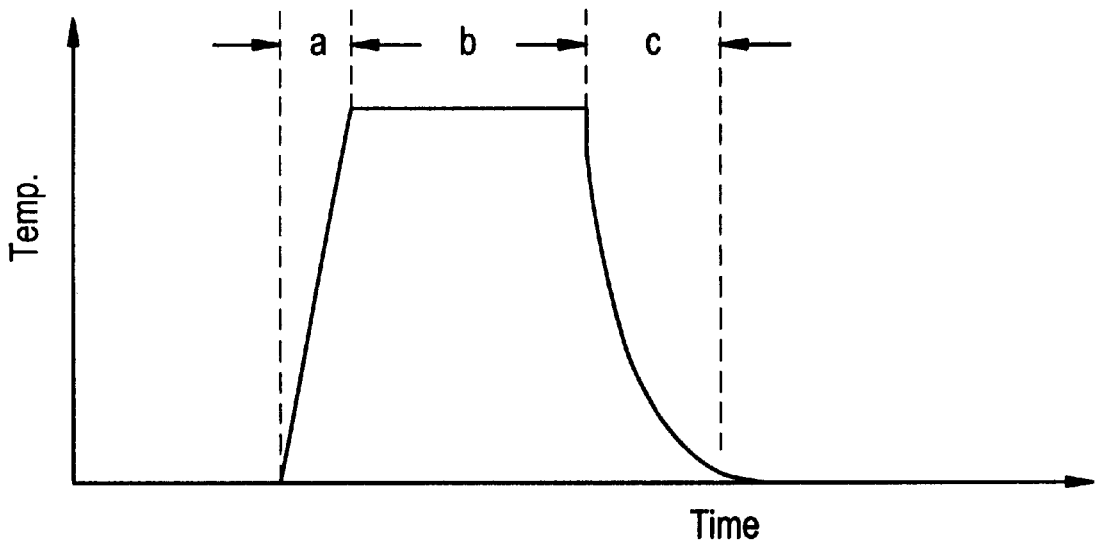
FIGS. 3A and 3B are diagrams showing temperature cycles in a heating step in accordance with the first example of the invention.

FIG. 3A shows a general type of a temperature cycle comprising a heating step a, a retaining step b, and a cooling step c. In a process of this type, however, the substrate is subjected to a rapid heating from room temperature to a high temperature of 1,000° C., and to a rapid cooling from the high temperature to room temperature again. Such a heating cycle greatly influences the silicon film and the substrate, and in some cases, it may unfavorably cause the separation of the silicon film.

Figure 3B:
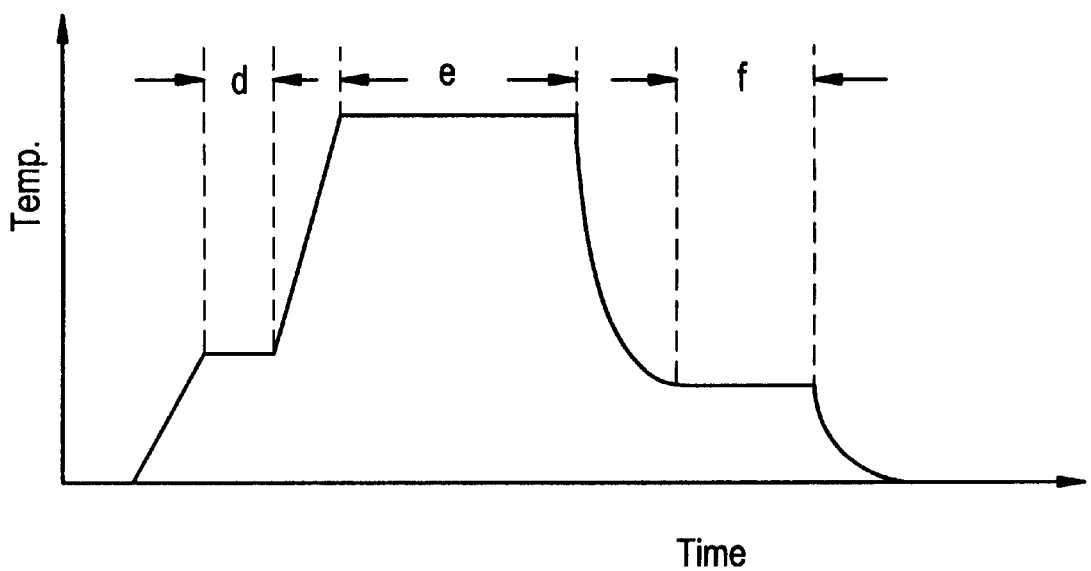
Figure 4A:
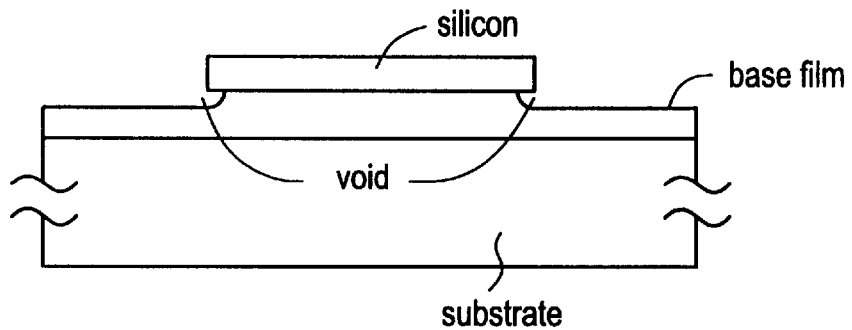
FIGS. 4A–4C are cross sectional views showing a manufacturing process of a semiconductor device in accordance with prior art.
Figure 4B:
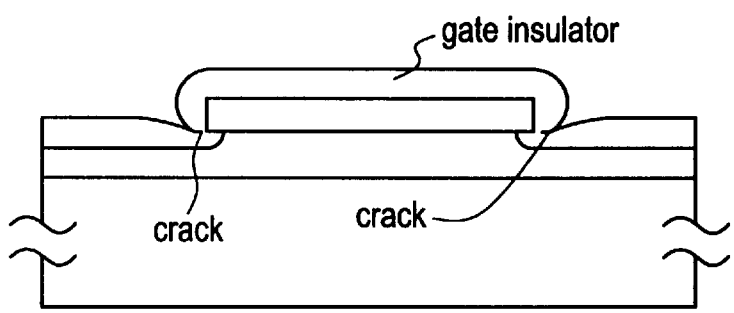
Figure 4C:
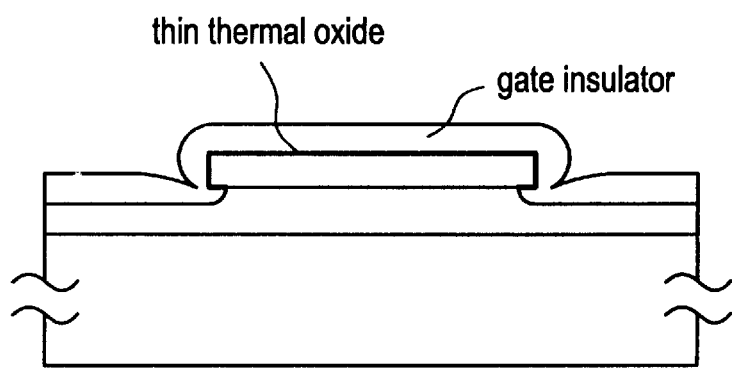

The heating cycle illustrated in FIG. 3B is provided as a means for overcoming the problem above. Referring to FIG. 3B, a pre-heating step d and a post-heating step f are provided additionally to keep the substrate and the silicon film in the temperature range of 200 to 500° C. not influencing the substrate and the silicon film before achieving the retention step.

The infrared radiation irradiated to the silicon film selectively heats the irradiated portion. Accordingly, the heating effect on the glass substrate can be minimized. Furthermore, the defects and dangling bonds in the silicon film can be effectively reduced by irradiating the infrared light. Thus, a silicon oxide film 104 having a thickness of from 50 to 150 Å was obtained by infrared irradiation.

Figure 1B:
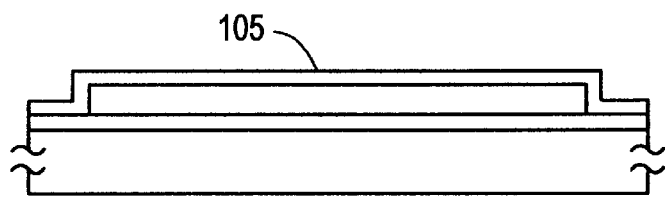

Then, a 1,000 Å thick silicon oxide film 105 was deposited as the gate insulating film by plasma CVD. The CVD process was effected using TEOS (tetraethoxysilane; $Si(OC_2H_5)_4$) and oxygen while maintaining the substrate temperature in the range of from 300 to 550° C., for example, at 400° C., during the deposition of the film. Trichloroethylene (TCE) gas was used in addition to TEOS and oxygen. TEOS, oxygen, and TCE were flown at a ratio of 5:10:1, but the flow ratio of the gases can be changed as desired according to the characteristics of the CVD apparatus used, since the ratio of the gases is not limited thereto (FIG. 1B).

The TCE mixed into the gas mixture supplies chlorine atoms to the silicon oxide film through the reaction. Chlorine prevents reaction from occurring between the electrodes with the film, or blocks mobile atoms such as those of sodium which intrude from the exterior into the film. The same effect can be obtained by mixing phosphorus into the silicon oxide film.

The thus formed silicon oxide film was annealed for one hour in a oxynitride gas ($N_2O$) at a temperature from 400–850° C., for example, 580° C.

Subsequently, a polycrystalline silicon film containing from 0.01 to 0.2% phosphorus was deposited by reduced pressure CVD to a thickness of from 3,000 to 8,000 Å, for example, at a thickness of 6,000 Å. The silicon film thus obtained was patterned to form gate electrodes 106 and 107. Then, impurities for rendering the active region (for source/drain and channel regions) either P- or N-conductive were incorporated in a self-aligned manner by ion doping (plasma doping) into the active region using the gate electrodes 106 and 107 as masks. Phosphine ($PH_3$) or diborane ($B_2H_6$) was used as the doping gas. In case the former (phosphine) is used, the accelerating voltage is set in the range of from 60 to 90 kV, for example, at 80 kV to incorporate phosphorus at a dose of from $1\times10^{15}$ to $8\times10^{15}$ $cm^{-2}$, for example, $5\times10^{15}$ $cm^{-2}$. In case the latter (diborane) is used, the voltage is set in the range of from 40 to 80 kV, for instance, at 65 kV, to introduce boron at a dose of from $1\times10^{15}$ to $8\times10^{15}$ $cm^{-2}$, for example, $2\times10^{15}$ $cm^{-2}$. In effecting doping, phosphorus and boron were each introduced selectively in the predetermined regions by covering the other region with a photoresist. Thus, N-type impurity regions 111 and 113, P-type impurity regions 108 and 110 were obtained as a result to form the region for a P-channel TFT (PTFT) and the region for an N-channel TFT (NTFT).

Figure 1C:
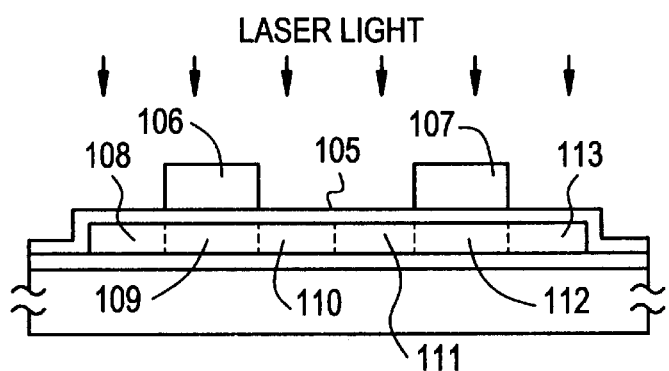

The structure was annealed thereafter by irradiating a laser radiation. The laser radiation used herein was a KrF excimer laser (having a wavelength of 248 nm and a pulse width of 20 nsec), but the type of laser is not limited thereto. The laser irradiation was effected at an energy density of 200 to 400 $mJ/cm^2$, for example, at 250 $mJ/cm^2$, and by applying from 2 to 10 shots, specifically, 2 shots, per site. It is further effective to heat the substrate during the laser beam irradiation to maintain the substrate temperature in the range of from about 200 to 450° C. (FIG. 1C).

This step can be effected by lamp annealing using a near infrared radiation. The near infrared radiation is absorbed more selectively by crystallized silicon as compared with amorphous silicon, and an effective annealing comparable to a thermal annealing at a temperature of 1,000° C. or higher can be realized. The glass substrate, however, hardly absorbs the light in the wavelength of from 0.5 to 4 μm corresponding to a range of from near infrared region to the visible region (but absorbs light in the far infrared region). Accordingly, this step can be effected in a short period of time without heating the glass substrate to a high temperature. Thus, the step above can be said ideal for a case in which the shrinkage of the glass substrate is found problematic.

Figure 1D:
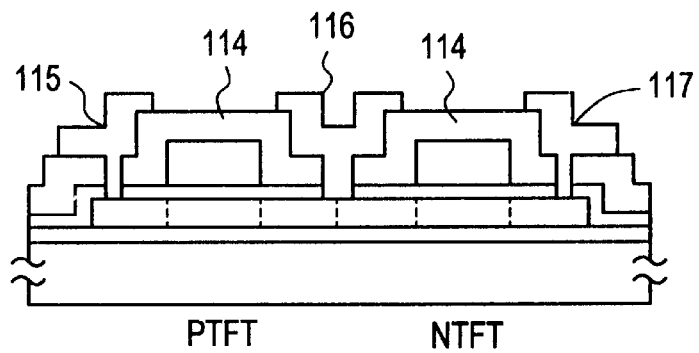

Subsequently to the step above, a silicon oxide film 114 was deposited at a thickness of 6,000 Å by plasma CVD to provide in interlayer dielectric. Polyimide can be used in the place of silicon oxide. Contact holes were formed further to form electrodes with wiring 115, 116, and 117 using a metallic material, for example, a multilayered film of titanium nitride and aluminum. A semiconductor circuit comprising TFTs in a complementary configuration was thus implemented by annealing the resulting structure at 350° C. for 30 minutes under gaseous hydrogen atmosphere at a pressure of 1 atm (FIG. 1D).

The circuit described in the foregoing comprises a PTFT and an NTFT combined in a CMOS structure. However, the process above can be applied to the fabrication of two separate TFTs by simultaneously fabricating two TFTs, and then splitting the resulting structure into two TPTS. The NTFT thus obtained according to the present example was found to have a mobility of from 110 to 200 $cm^2/Vs$ and an S value in the range of from 0.2 to 0.5 V/digit. The PTFT was found to have a mobility in the range of from 50 to 120 $cm^2/Vs$ and an S value in the range of from 0.4 to 0.6 V/digit. As compared to the cases in which the gate dielectric is formed by known PVD or CVD processes, the TFT according to the present invention was found to have a mobility of 20% or more higher, and an S value reduced to a half of the conventional values.

EXAMPLE 2

The present example refers to another complementary TFT circuit. Referring to FIG. 2, the present example is described in detail below. A Corning 7059 glass substrate 201 was annealed in the temperature range of from 620 to 660° C. for a duration of 1 to 4 hours, gradually cooled at a rate of from 0.1 to 1.0° C./minute, preferably, at a rate of from 0.1 to 0.3° C./minute to a temperature in the range of from 450 to 590° C., and was taken out from the heat treatment apparatus. A base film 202 was formed on the substrate thereafter, and an amorphous silicon film 203 was deposited at a thickness of from 300 to 800 Å by plasma CVD. A nickel film from 20 to 50 Å in thickness was deposited by sputtering in the region 205 using a silicon oxide mask 204 having a thickness of 1,000 Å. The nickel film need not be a continuous film.

Then, the resulting structure was subjected to thermal annealing in a gaseous nitrogen atmosphere in the temperature range of from 500 to 620° C., for example, at 550° C., for a duration of 8 hours to crystallize the silicon film 203. The crystallization occurred as such that the crystals were found to initiate their growth from the region 205 of the silicon film in contact with nickel, and to proceed the growth in a direction in parallel with the substrate, i.e., along the direction indicated with an arrow in the figure (FIG. 2A).

Then, an island-like active layer region 205 was formed by patterning the silicon film 203. The active layer was etched anisotropically in the direction perpendicular to the active layer by RIE process. In FIG. 2A, the hatched region indicates the region in which nickel is present at high concentration. This particular region was found to contain nickel at a concentration about one digit higher than the crystallized regions sandwiched by those nickel-rich regions. Thus, the channel forming region of the TFT in this example was formed in regions other than those regions containing nickel at a high concentration. The nickel concentration of the active layer in this example was found to be in the range of about $10^{17}$ to $10^{19}$ $CM^{-3}$.

The substrate was annealed thereafter under gaseous oxygen atmosphere at 600° C. for a duration of 1 hour. As a result, a thermal oxide film 206 having a thickness of from 20 to 200 Å, representatively, from 40 to 100 Å, was formed on the surface of the active layer. This step further improves the crystallinity of the region previously crystallized by thermal annealing (FIG. 2B).

A silicon oxide gate dielectric (about 70 to 120 nm in thickness; typically, 120 nm) 207 was formed by plasma CVD under a gaseous oxygen atmosphere using tetraethoxysilane (TEOS). From 3 to 50% of trichloroethylene (TCE was added into the gas flow with respect to TEOS during the film deposition while maintaining the temperature of the substrate to 350° C. After forming a silicon oxide film 207, the resulting structure was annealed again under a gaseous oxygen atmosphere at 600° C. for a duration of 1 hour. The gate dielectric 207 was established in this manner (FIG. 2C).

Subsequently, an aluminum film containing from 0.01 to 0.2% of scandium was deposited by sputtering to a thickness of 6,000 Å, and was patterned to form gate electrodes 209 and 210. The periphery of the gate electrodes was covered with anodic oxide 211 and 212 by anodically oxidizing the periphery thereof. The anodic oxidation was effected in an ethylene glycol solution containing from 1 to 5% tartaric acid. The oxide film 211 and 212 thus obtained were each 2,000 Å in thickness. Since the oxide 211 and 212 can be formed to such a thickness capable of forming an offset gate region, the length of the offset gate region can be determined by the anodic oxidation step.

Impurities for rendering the source and the drain regions N-type and P-type conductive were introduced in a self-aligned manner by ion doping to form a P-type source region 213, a P-type drain region 215, an N-type source region 216, an N-type drain region 218, and channel forming regions 214 and 217. Then, a laser radiation was irradiated using a KrF excimer laser to recover the crystallinity of the silicon film which was damaged by the doping of impurities. The laser radiation was applied at an energy density of 250 to 300 mJ/cm$^2$. The sheet resistance of the source/drain regions of the TFT was found to be in the range of from 300 to 800 Ω/cm$^2$ after the laser irradiation (FIG. 2D). This step may be conducted otherwise by lamp annealing.

An interlayer dielectric 219 using silicon oxide or polyimide was formed thereafter, and contact hole was formed therethrough to form electrodes 220, 221, and 222 in the source/drain regions of the TFT using a multilayered chromium/aluminum film. The structure was completed into a TFT by annealing the structure at a temperature of from 200 to 400° C. for 2 hours in hydrogen to effect hydrogenation. To further improve the moisture resistance, a passivation film can be formed over the entire surface using silicon nitride and the like (FIG. 2E).

EXAMPLE 3

FIGS. 5A–5G shows the step-sequential cross section structures obtained in the fabrication process according to the present example. A 2,000 Å thick silicon oxide film was deposited as a base film 502 on a Corning 7059 glass substrate 501. The substrate was then annealed in the temperature range of from 620 to 660° C. for a duration of 1 to 4 hours, gradually cooled at a rate of from 0.1 to 1.0° C./minute, preferably, at a rate of from 0.1 to 0.3° C. /minute to a temperature in the range of from 450 to 590° C., and was taken out from the heat treatment apparatus.

Figure 5A:
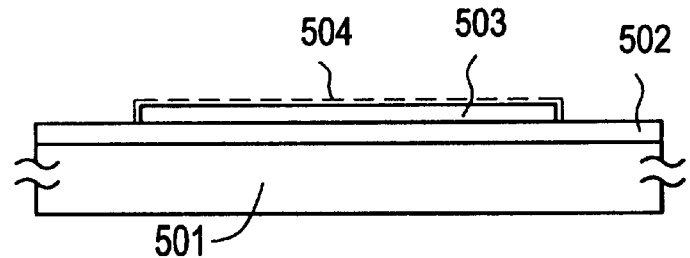
FIGS. 5A–5G are cross sectional views showing a manufacturing process of a semiconductor device in accordance with a third example of the invention.

Then, a film of an intrinsic (I-type) amorphous silicon film was deposited by plasma-assisted CVD to a thickness of from 500 to 1,500 Å, for example, 1,000 Å. The amorphous silicon film thus deposited was annealed for 48 hours at 600° C. under a nitrogen inert gas atmosphere at the atmospheric pressure for crystallization. The silicon film thus obtained was then patterned to island-like silicon film portions 503 from 10 to 1,000 μm in size to obtain the active layer of the TFT. An infrared light having a peak in the wavelength range of from 0.5 to 4 μm, specifically in this case, in a wavelength of from 0.8 to 1.4 μm, was irradiated under a gaseous oxygen atmosphere for a duration of from 30 to 180 seconds to form a silicon oxide film 504 on the surface of the active layer 503. The infrared radiation was irradiated under the same conditions as those used in Example 1 (FIG. 5A). It is also possible to add from 0.1 to 10% of hydrogen chloride (HCl) into the atmosphere.

Then, a 1,000 Å thick silicon oxide film 505 was deposited as a gate dielectric by plasma CVD. The CVD process was effected using TEOS (tetraethoxysilane; $Si(OC_2H_5)_4$) and oxygen while maintaining the substrate temperature in the range of from 300 to 550° C., for example, at 400° C., during the deposition of the film. Trichloroethylene (TCE) gas was used in addition to TEOS and oxygen. TEOS, oxygen, and TCE were flown at a ratio of 5:10:1, but the flow ratio of the gases can be changed as desired according to the characteristics of the CVD apparatus used, since the ratio of the gases is not limited thereto.

Subsequently, a polycrystalline silicon film containing from 0.01 to 0.2% phosphorus was deposited by reduced pressure CVD to a thickness of from 3,000 to 8,000 Å, for example, at a thickness of 6,000 Å. The gate electrode need not be made from polycrystalline silicon, and other usable films include a multilayered film of silicon and molybdenum, a multilayered film of silicon and molybdenum silicide, a multilayered film of silicon and titanium, a multilayered film of silicon and titanium silicide, a multilayered film of silicon and tungsten, and a multilayered film of silicon and tungsten silicide.

The silicon film thus obtained was patterned to form a gate electrodes 506. Then, an impurity for rendering the active region (for source/drain and channel regions) N-conductive was incorporated in a self-aligned manner by ion doping (plasma doping) into the active region using the gate electrode 506 as a mask. Phosphine ($PH_3$) was used as the doping gas, and doping was effected by setting the accelerating voltage in the range of from 60 to 90 kV, for example, at 80 kV, to incorporate phosphorus at a dose of from $1\times10^{15}$ to $8\times10^{15}$ cm$^{-2}$, for example, $5\times10^{15}$ cm$^{-2}$. The N-type impurity regions 507 and 509 were thus obtained as a result.

Figure 5B:
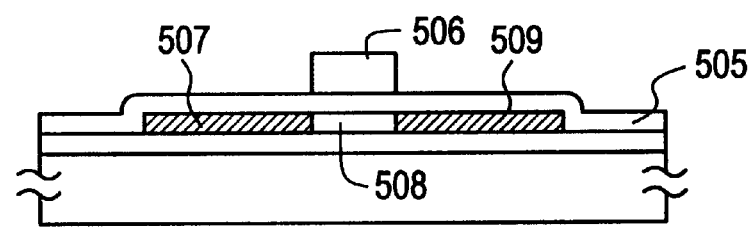

The structure was annealed thereafter by irradiating a laser radiation. The laser radiation used herein was a KrF excimer laser (having a wavelength of 248 nm and a pulse width of 20 nsec), but the type of laser is not limited thereto. The laser irradiation was effected at an energy density of 200 to 400 mJ/cm$^2$, for example, at 250 mJ/cm$^2$, and by applying from 2 to 10 shots, specifically, 2 shots, per site. It is further effective to heat the substrate during the laser beam irradiation to maintain the substrate temperature in the range of from about 200 to 450° C. (FIG. 5B). This step can be effected by lamp annealing using a near infrared radiation.

Figure 5C:
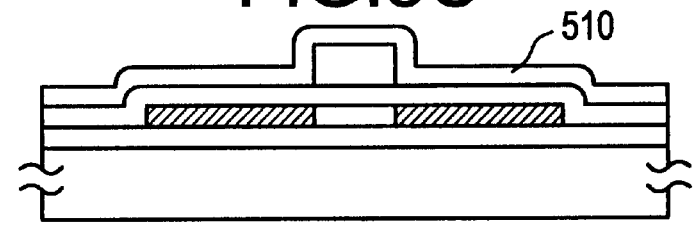

Subsequent to the annealing above, a silicon oxide film 510 was deposited by plasma CVD to a thickness of from 3,000 to 9,000 Å, for example, at a thickness of 9,000 Å (FIG. 5C).

Figure 5D:
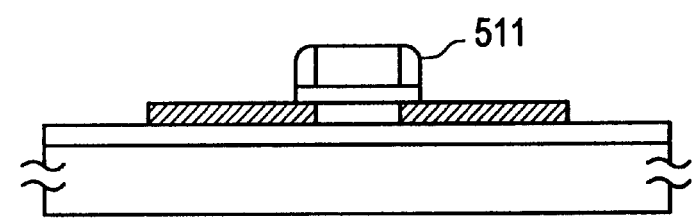

The silicon oxide film 510 was subjected to anisotropic dry etching using a known RIE process. Thus, on the side of a gate electrode 506 having a height of 9,000 Å, the thickness along the direction of the height was found to be about twice the thickness of the silicon oxide film (which was deposited to a thickness of 9,000 Å). The silicon oxide film 505 provided as the gate dielectric was etched at the same time to expose the source/drain regions 507 and 509 to air. Thus was obtained an insulator 511 as a spacer shaped approximately into a triangle on the side of the gate electrode (FIG. 5D).

Figure 5E:
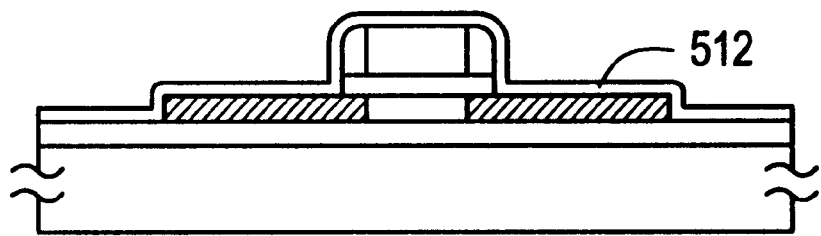

Referring to FIG. 5E, a titanium film 512 was deposited to a thickness of from 50 to 500 Å by means of sputtering. The resulting titanium film was heated to a temperature range of from 250 to 450° C. to form titanium suicide regions 513 and 515 on the impurity regions (source/drain regions) by allowing titanium to undergo reaction with silicon. In addition, a titanium silicide region 514 was formed through the reaction of titanium with the material constituting the gate electrode (i.e., phosphorus-doped silicon). The practical sheet resistance of the source and drain regions was found to be 10 Ω/58 or lower, because the resistivity of titanium silicide is as low as to yield a value in the range of from 30 to 100 $\mu\Omega$·cm.

Figure 5F:
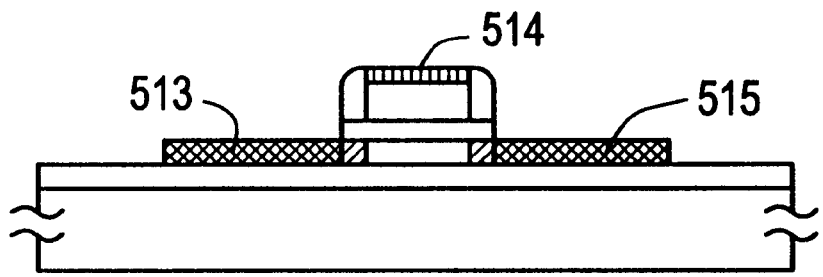

This step can be effected by lamp annealing using an infrared light. In case lamp annealing is effected, the temperature of the surface of the object must fall in the range of from 600 to 1,000° C. If lamp annealing is effected at 600° C., the annealing must endure for several minutes. If the annealing is effected at a surface temperature of 1,000° C., on the other hand, the irradiation of light must be completed within several seconds (FIG. 5F).

Figure 5G:
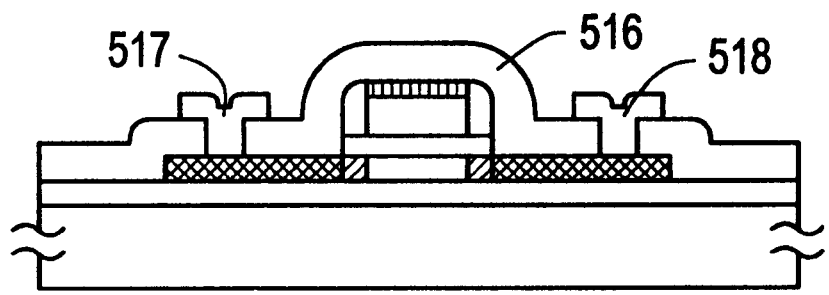

The titanium film thus obtained was then etched using an etching solution comprising a 5:2:2 mixture of hydrogen peroxide, ammonia, and water. The titanium silicide layers 513, 514, and 515 can be left behind because they cannot be etched by the solution above. Finally, a complete TFT as shown in FIG. 5G was implemented by forming a silicon oxide film at a thickness of 5,000 Å by CVD as an interlayer dielectric 516 over the entire surface of the structure, boring contact holes to the source and drain of the TFT, and forming aluminum electrodes with wiring 517 and 518. Since the structure according to the present example comprise the aluminum electrodes 517 and 518 not in direct contact with silicon in the source/drain regions, an extremely favorable contact can be obtained. The complete TFT thus obtained may be further subjected to hydrogen annealing in the temperature range of from 200 to 400° C. to activate the impurity regions.

EXAMPLE 4

FIGS. 6A–6G show the step-sequential cross section structures obtained in the fabrication process according to the present example. A 2,000 Å thick silicon oxide film was deposited as a base film 602 on a Corning 7059 glass substrate 601. The substrate was then annealed in the temperature range of from 620 to 660° C. for a duration of 1 to 4 hours, gradually cooled at a rate of from 0.1 to 1.0° C./minute, preferably, at a rate of from 0.1 to 0.3° C./minute to a temperature in the range of from 450 to 590° C., and was taken out from the heat treatment apparatus.

Figure 6A:
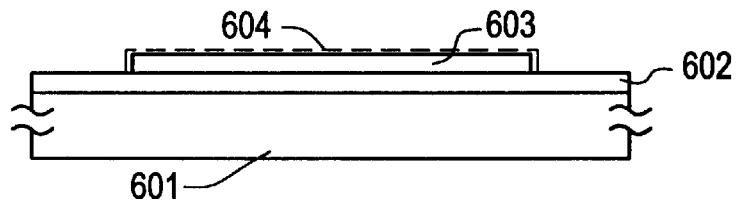
FIGS. 6A–6G are cross sectional views showing a manufacturing process of a semiconductor device in accordance with a fourth example of the invention.

Then, a film of an intrinsic (I-type) amorphous silicon film was deposited by plasma-assisted CVD to a thickness of from 500 to 1,500 Å, for example, 1,000 Å. The amorphous silicon film, thus deposited crystallized in the same manner as in Example 2 by using nickel as a catalyst. Thus, the crystallization was effected for a duration of 4 hours at 550° C. under a gaseous nitrogen atmosphere at the atmospheric pressure. The silicon film thus obtained was then patterned to island-like silicon film portions 603 from 10 to 1,000 $\mu$m in size to obtain the active layer of the TFT. The surface of the active layer 603 was coated with a silicon oxide film 604 by oxidizing the active layer at 600° C. for a duration of one hour in a gaseous oxygen atmosphere (FIG. 6A).

Then, a 1,000 Å thick silicon oxide film 605 was deposited as the gate dielectric by plasma CVD. The CVD process was effected using TEOS (tetraethoxysilane; Si(OC$_2$H$_5$)$_4$) and oxygen while maintaining the substrate temperature in the range of from 300 to 550° C., for example, at 350° C., during the deposition of the film. Trichloroethylene (TCE) gas was used in addition to TEOS and oxygen. TEOS, oxygen, and TCE were flown representatively at a ratio of 5:10:1, but the flow ratio of the gases can be changed as desired according to the characteristics of the CVD apparatus used, since the ratio of the gases is not limited thereto.

Subsequently, an aluminum film containing from 0.01 to 0.2% of scandium was deposited by electron beam deposition to a thickness of from 2,000 Å to 5 $\mu$m, and was patterned to form a gate electrode 606. The periphery of the gate electrode 606 was covered with anodic oxide 607 having a thickness of from 500 to 2,500 Å by anodically oxidizing the periphery of the gate electrodes in an electrolytic solution. The conditions and the detail of the anodic oxidation were the same as those described in Japanese patent application Hei-4-30220 filed Jan. 21, 1992. The gate electrode need not be a single layer of aluminum, and other usable films include a multilayered film of phosphorus-doped silicon and aluminum. As a matter of course, other anodically oxidizable materials such as titanium and tantalum can be used as well.

Figure 6B:
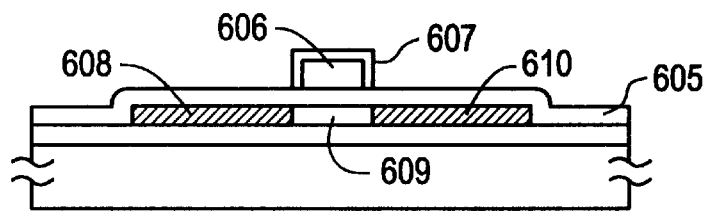

Impurities were introduced by ion doping into the island-like silicon film provided to each of the TFTs using the gate electrode portions (i.e., the gate electrode and the anodic oxide film provided to the periphery thereof) as masks. Thus were obtained the source/drain regions (impurity regions) 608 and 610 as shown in FIG. 6B. Phosphorus must be introduced as the impurity by using phosphine (PH$_3$) as the doping gas in case an NMOS TFT is to be formed. In case of forming a PMOS TFT, on the other hand, boron must be introduced as the impurity by using diborane (B$_2$H$_6$) as the doping gas. Thus, the impurities were introduced at a dose of from $2 \times 10^{14}$ to $8 \times 10^{14}$ cm$^{-2}$ and at an accelerating voltage of from 10 to 90 keV.

The structure was annealed thereafter by irradiating a laser radiation. The laser radiation used herein was a KrF excimer laser (having a wavelength of 248 nm and a pulse width of 20 nsec), but the type of laser is not limited thereto. The laser irradiation was effected at an energy density of 200 to 400 mJ/cm$^2$, for example, at 250 mJ/cm$^2$, and by applying from 2 to 10 shots, for example, 2 shots, per site. It is further effective to heat the substrate during the laser beam irradiation to maintain the substrate temperature in the range of from about 200 to 450° C. (FIG. 6B). This step can be effected by lamp annealing using a near infrared radiation.

Figure 6C:
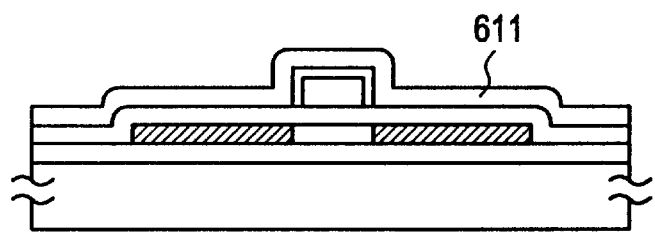

Subsequent to the annealing above, a silicon oxide film 611 was deposited by plasma CVD to a thickness of from 4,000 Å to 1.5 μm, for example, at a thickness of 9,000 Å (FIG. 6C).

Figure 6D:
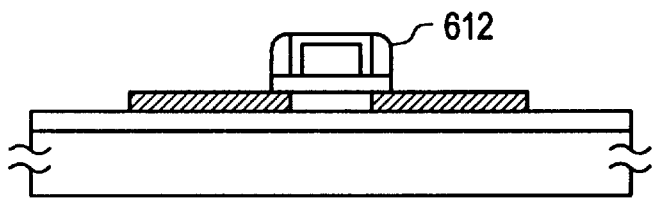

The silicon oxide film 611 was subjected to anisotropic dry etching using a known RIE process. Thus, on the side of a gate electrode 606 having a height of 9,000 Å, the thickness along the direction of the height was found to be about twice the thickness of the silicon oxide film. The silicon oxide film 605 provided as the gate dielectric was etched at the same time to expose the source/drain regions 608 and 610. Thus was obtained an insulator 612 as a spacer on the side of the gate electrode (FIG. 6D).

Figure 6E:
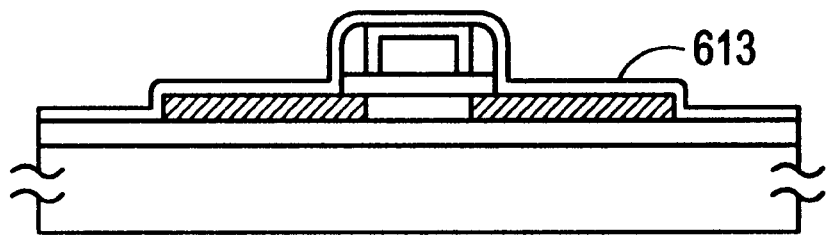

Referring to FIG. 6E, a titanium film 613 was deposited to a thickness of from 50 to 500 Å by means of sputtering. The resulting titanium film was heated to a temperature range of from 250 to 450° C. to form titanium silicide regions 614 and 615 on the impurity regions (source/drain regions) by allowing titanium to undergo reaction with silicon. The heating treatment in this case is effected preferably in the temperature range as such that no hillocks may form on the gate electrode and the like.

Figure 6F:
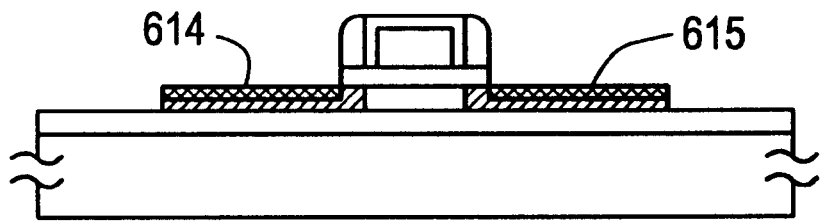

This step can be effected by lamp annealing using an infrared light. In case lamp annealing is effected, the temperature of the surface of the object must fall in the range of from 600 to 1,000° C. If lamp annealing is effected at 600° C., the annealing must endure for several minutes. If the annealing is effected at a surface temperature of 1,000° C., on the other hand, the irradiation of light must be completed within several seconds (FIG. 6F).

Figure 6G:
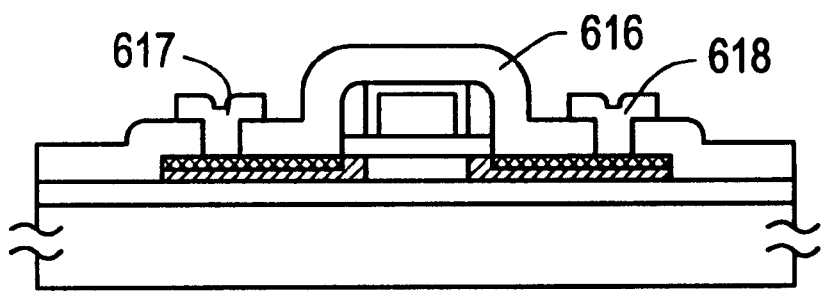

The titanium film thus obtained was then etched using an etching solution comprising a 5:2:2 mixture of hydrogen peroxide, ammonia, and water. The silicide layers 614 and 615 can be left behind because they cannot be etched by the solution above. Finally, a complete TFT as shown in FIG. 6G was implemented by depositing a silicon oxide film at a thickness of 3,000 Å by CVD as an interlayer dielectric film over the entire surface of the structure, forming contact holes to the source and drain of the TFT, and forming aluminum electrodes with wiring 617 and 618. Thus was implemented a complete TFT.

EXAMPLE 5

The present example is a modification of the structure described in Example 1. For the sake of simplicity, the steps which can be effected in the same manner as in Example are excluded from the following explanation.

Figure 7A:
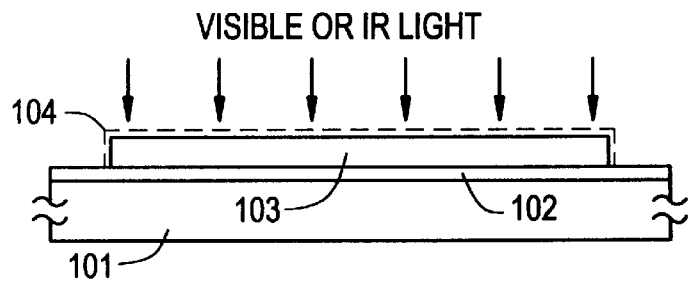
FIGS. 7A–7D are cross sectional views showing a manufacturing process of a semiconductor device in accordance with a fifth example of the invention.
Figure 7B:
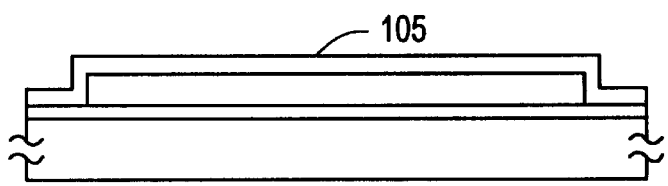
Figure 7C:
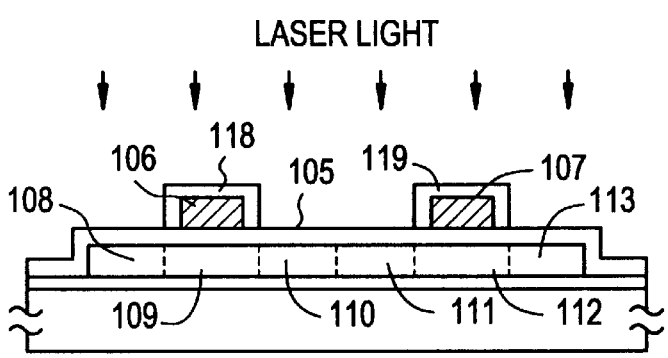
Figure 7D:
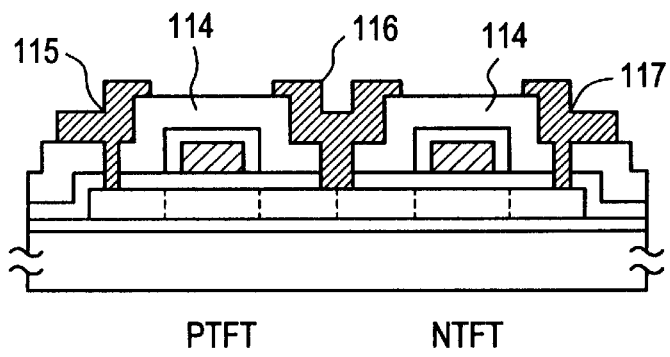

The same process as that described in Example 1 was repeated up to the formation of a gate dielectric 105 as shown in FIG. 7B. Then, an aluminum film containing from 0.01 to 0.2% of scandium was deposited by sputtering to a thickness of from 6,000 to 8,000 Å, 6,000 Å for instance in this case, and was patterned to form gate electrodes 106 and 107. The periphery of the gate electrodes was covered with anodic oxide 118 and 119 by anodically oxidizing the periphery thereof. The anodic oxidation was effected in an ethylene glycol solution containing from 1 to 5% tartaric acid. The oxide film 118 and 119 thus obtained were each 2,000 Å in thickness. Since the oxide 118 and 119 can be formed to such a thickness capable of forming an offset gate region, the length of the offset gate region can be determined by the anodic oxidation step.

Then, impurities for rendering the active region (for source/drain and channel regions) either P- or N-conductive were incorporated in a self-aligned manner by ion doping (plasma doping) into the active region using the gate electrode 106 and the peripheral oxide layer 118, and the gate electrode 107 and the peripheral oxide layer 119 as masks. Phosphine ($PH_3$) or diborane ($B_2H_6$) was used as the doping gas. In case the former (phosphine) is used, the accelerating voltage is set in the range of from 60 to 90 kV, for example, at 80 kV, to incorporate phosphorus at a dose of from $1\times10^{15}$ to $8\times10^{15}$ $cm^{-2}$, for example, $5\times10^{15}$ $cm^{-2}$. In case the latter (diborane) is used, the voltage is set in the range of from 40 to 80 kV, for instance, at 65 kV, to introduce boron at a dose of from $1\times10^{15}$ to $8\times10^{15}$ $cm^{-2}$, for example, $2\times10^{15}$ $cm^{-2}$. In effecting doping, phosphorus and boron were each introduced selectively in the predetermined regions by covering the other region with a photoresist. Thus, N-type impurity regions 111 and 113, P-type impurity regions 108 and 110 were obtained as a result to form the region for a P-channel TFT (PTFT) and the region for an N-channel TFT (NTFT).

The subsequent steps are the same as those of Example 1, and the explanation thereof is therefore omitted.

The circuit described in the foregoing comprises a PTFT and an NTFT combined in a CMOS structure. However, the process above can be applied to the fabrication of two separate TFTs by simultaneously fabricating two TFTs, and then splitting the resulting structure into two TFTS. The NTFT thus obtained according to the present example was found to have a mobility of from 110 to 150 $cm^2/Vs$ and an S value in the range of from 0.2 to 0.5 V/digit. The PTFT was found to have a mobility in the range of from 90 to 120 $cm^2/Vs$ and an S value in the range of from 0.4 to 0.6 V/digit. As compared to the cases in which the gate dielectric is formed by known PVD or CVD processes, the TFT according to the present invention was found to have a mobility of 20% or more higher, and an S value reduced to a half of the conventional values.

EXAMPLE 6

The present Example also relates to a complementary TFT circuit. FIGS. 8A–8D show schematically the step-sequential cross section structures obtained in the fabrication process according to the present example. A Corning 7059 glass substrate 101 having a thickness of 1.1 mm and a size of 300×400 mm was first annealed for 1 hour at 640° C. in the same manner as in Example 5, and was then gradually cooled to 580° C. at a cooling rate of 0.2° C./minute. A silicon oxide base film 102 was formed at a thickness of 2,000 Å by plasma CVD. TEOS and oxygen were used as the starting material gases for the CVD. The substrate was maintained at a temperature of 350° C. The silicon oxide base film can be deposited by means of sputtering instead of plasma CVD.

Then, an amorphous silicon film was deposited at a thickness of 500 Å by LPCVD or plasma CVD process. The resulting film was patterned to form an active layer 103 for the TFT. After subjecting the resulting structure to dehydrogenation at 450° C. for a duration of 1 hour, laser radiation was irradiated for crystallization. The laser radiation used herein was a KrF excimer laser (having a wavelength of 248 nm). The laser irradiation was effected at an energy density of 200 to 450 $mJ/cm^2$, and by applying from 2 shots per site. The substrate was heated during the laser beam irradiation to maintain the substrate temperature in the range of from about 350 to 500° C.

After the step of laser irradiation, the substrate was annealed in gaseous oxygen atmosphere at 600° C. for 1 hour. As a result, a thermal oxide film 104 was found to form on the surface of the active layer at a thickness of from 20 to 200 Å, representatively, at a thickness of from 40 to 100 Å (FIG. 8 A).

Figure 8A:
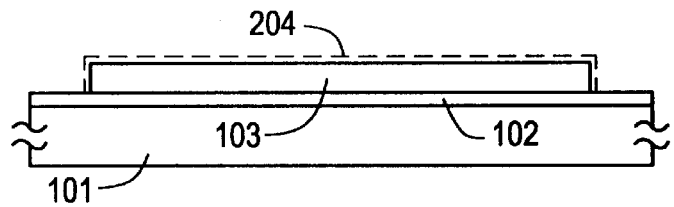
FIGS. 8A–8D are cross sectional views showing a manufacturing process of a semiconductor device in accordance with a sixth example of the invention.
Figure 8B:
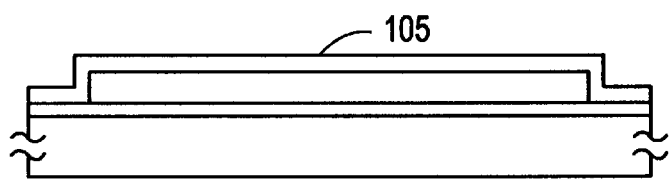

A silicon oxide gate dielectric was formed at a thickness of from 70 to 120 nm, typically at 120 nm, by plasma CVD using tetraethoxysilane (TEOS) as the starting material. During the film deposition, trichloroethylene (TCE) was added to TEOS at an amount of from 3 to 50% in terms of flow rate, and the substrate temperature was maintained at 350° C. Thus was obtained a gate dielectric 105 (FIG. 8B).

A 6,000 Å thick aluminum film was formed thereafter by sputtering, and was patterned to form gate electrodes 106 and 107. The periphery of the gate electrodes was covered with anodic oxide 118 and 119 in the same manner as in Example 4.

Figure 8C:
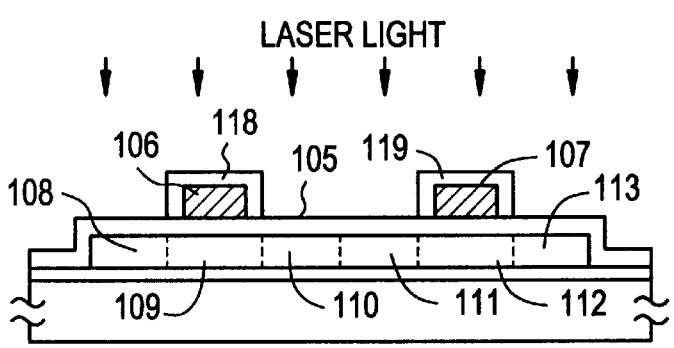

N-type and P-type impurities were introduced in a self-aligned manner by ion doping to form a P-type source region 108, a P-type drain region 110, an N-type source region 111, an N-type drain region 113, and channel forming regions 109 and 112. Then, a laser radiation was irradiated using a KrF excimer laser to recover the crystallinity of the silicon film which was damaged by the doping of impurities. The laser radiation was applied at an energy density of 250 to 300 mJ/cm². The sheet resistance of the source/drain regions of the TFT was found to be in the range of from 300 to 800 Ω/cm² after the laser irradiation (FIG. 8C). This step may be conducted otherwise by lamp annealing.

Figure 8D:
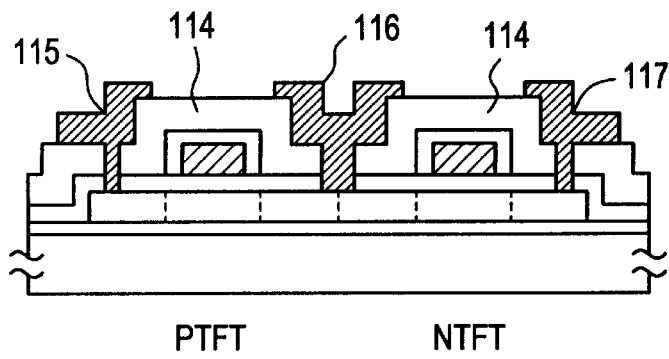

An interlayer dielectric 114 using silicon oxide or polyimide was formed thereafter, and contact hole was formed therethrough to form electrodes 115, 116, and 117 in the source/drain regions of the TFT using a multilayered chromium/aluminum film. The structure was completed into a TFT by annealing the structure for 2 hours at a temperature range of from 200 to 400° C. in hydrogen to effect hydrogenation. To further improve the moisture resistance, a passivation film can be formed over the entire surface using silicon nitride and the like (FIG. 8D).

EXAMPLE 7

Referring to FIGS. 9A–9E, the present Example is explained below. A Corning 7059 glass substrate 101 was annealed in the temperature range of from 620 to 660° C. for a duration of 1 to 4 hours, gradually cooled at a rate of from 0.1 to 1.0° C./minute, preferably, at a rate of from 0.1 to 0.3° C./minute, to a temperature in the range of from 450 to 590° C., and was taken out from the heat treatment apparatus. A base film 102 was formed on the substrate thereafter, and an amorphous silicon film 103 was deposited at a thickness of from 300 to 800 Å by plasma CVD. A nickel film from 20 to 50 Å in thickness was deposited by sputtering in the region 119 using a silicon oxide mask 118 having a thickness of 1,000 Å. The nickel film need not be a continuous film.

Figure 9A:
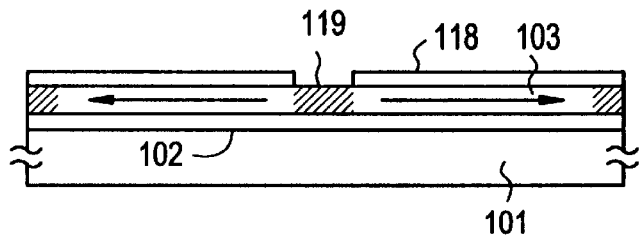
FIGS. 9A–9E are cross sectional views showing a manufacturing process of a semiconductor device in accordance with a seventh example of the invention.

Then, the resulting structure was subjected to thermal annealing in a gaseous nitrogen atmosphere in the temperature range of from 500 to 620° C., for example, at 550° C., for a duration of 8 hours to crystallize the silicon film 103. The crystallization occurred as such that the crystals were found to initiate their growth from the region 119 of the silicon film at which the silicon film was brought into direct contact with nickel, and to proceed the growth in a direction in parallel with the substrate, i.e., along the direction indicated with an arrow in the figure (FIG. 9A).

Figure 9B:
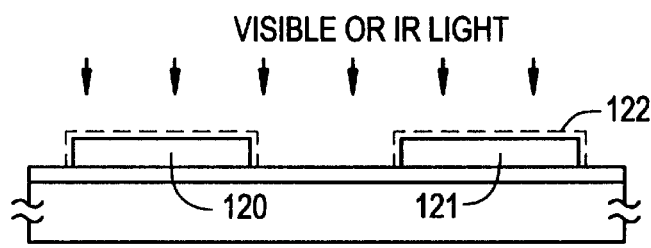
Figure 9C:
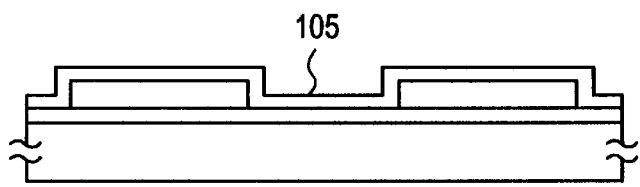
Figure 9D:
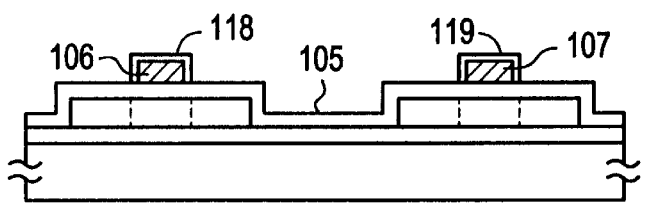

Then, island-like active layer regions 120 and 121 were formed by patterning the silicon film 103. The active layer was etched anisotropically in the direction perpendicular to the active layer by RIE process. In FIG. 9A, the region 119 indicates the region in which nickel is present at high concentration. Furthermore, the front edge of crystal growth was also found to contain nickel at high concentration. These particular regions were found to contain nickel at high concentration about one digit higher than the crystallized regions sandwiched by the nickel-rich regions. Thus, the active regions 120 and 121 were patterned in the regions other than those containing nickel at a high concentration. Accordingly, the active region for the TFT in this example was formed in the region containing almost no nickel. The nickel concentration of the active layer in this example was found to be in the range of about $10^{17}$ to $10^{19}$ cm$^{-3}$. A visible or a near infrared light was irradiated under the same conditions as those in Example 1 to form a silicon oxide film 122 on the surface of the active layers 120 and 121 to a thickness of from 50 to 150 Å, and also to improve the crystallinity of the region which was crystallized previously by thermal annealing (FIG. 9B).

Figure 9E:
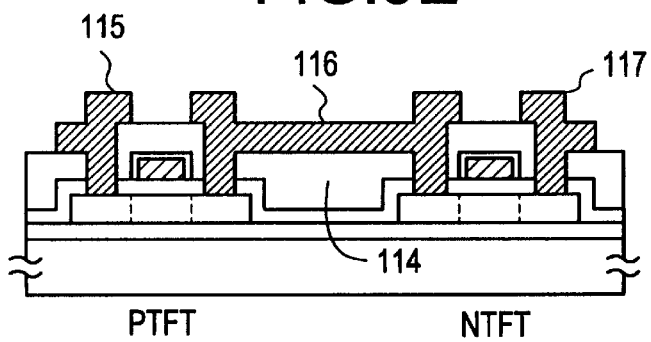

Then, in the same manner as in Example 4, a gate dielectric 105 was deposited (FIG. 9C), gate electrodes 106 and 107 were formed, P-type and N-type impurities were introduced, an interlayer dielectric 114 was formed, contact holes were perforated, and metal lines 115, 116 and 117 were formed (FIG. 9E).

EXAMPLE 10

Referring to FIG. 10 in which the process steps according to the present Example is shown schematically, the Example is described below. The present Example refers to a process which comprises forming a thin oxide film on the surface of an island-like silicon layer and accelerating the crystallization of the silicon layer by irradiating a KrF excimer laser radiation (operated at a wavelength of 248 nm) under an oxidizing atmosphere. The process for fabricating a switching transistor for a pixel in an active matrix circuit using the thus processed silicon film is described.

Similar to the process of Example 7, a 2,000 Å thick silicon oxide base film 102 and a 500 Å thick amorphous silicon film 103 were were formed on a substrate 101 obtained by first annealing it at 640° C. for a duration of 1 hour and gradually cooling it to 580° C. at a rate of 0.2° C./minute. Furthermore, a silicon oxide film from 10 to 100 Å in thickness was formed on the surface of the amorphous silicon film 103 by means of thermal oxidation or by treating the surface with an oxidizing agent such as aqueous hydrogen peroxide.

Figure 10A:
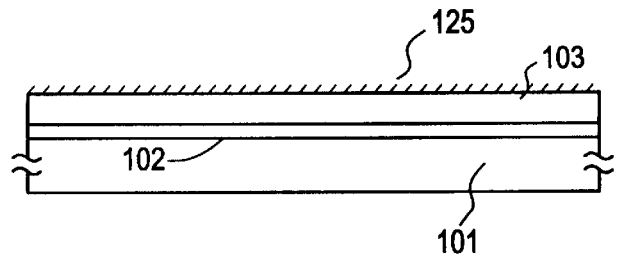
FIGS. 10A–10E are -cross sectional views showing a manufacturing process of a semiconductor device in accordance with a tenth example of the invention.
Figure 10B:
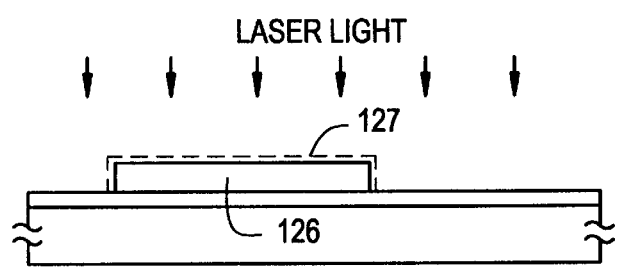

An extremely thin nickel acetate layer 125 was formed thereafter by spin coating. The solvent used herein was water or ethanol, and the concentration of nickel acetate was controlled to fall in the range of from 10 to 50 ppm (FIG. 10A).

The resulting substrate was annealed at 550° C. for a duration of 4 to 8 hours. As a result, the amorphous silicon film 103 was found to crystallize by the crystallization accelerating effect cast by nickel. It was observed that a part of the film from one to several micrometers in size was left amorphous even after the crystallization.

The silicon film was etched thereafter by a known photolithography process to obtain the island-like silicon region 126. The oxide film which remained on the surface of the silicon film was removed in this step.

Then, the substrate was placed in a gaseous oxygen atmosphere, and a KrF excimer laser was irradiated thereto. The laser irradiation was effected at an energy density of 250 to 450 mJ/cm², and by applying from 10 to 50 shots per site.

A silicon oxide film 127 from 10 to 50 Å in thickness was obtained as a result. The energy density and the number of laser shots upon applying the laser radiation can be selected according to the silicon oxide film 127 to be obtained. Thus, the amorphous region remaining in the crystalline silicon film was found to crystallize, and the crystallinity of the silicon film was also found to be improved. Thermal annealing can be applied again after the present step under the same conditions as those described above (FIG. 10B).

Figure 10C:
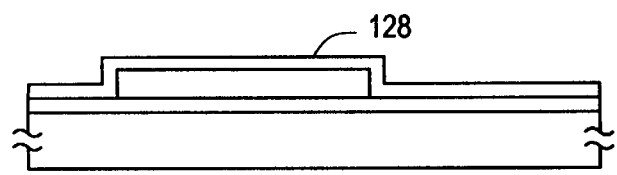

A 1,200 Å thick silicon oxide film 128 was deposited as a gate dielectric by plasma CVD. TEOS (tetraethoxysilane; $Si(OC_2H_5)_4$) and oxygen were used as the starting material gas, and the substrate was maintained in the temperature range of from 300 to 550° C., for example, at 400° C., during the deposition of the film (FIG. 10C).

Then, an aluminum film containing from 0.01 to 0.2% of scandium was deposited by sputtering to a thickness of from 3,000 to 8,000 Å, 6,000 Å for instance in this case, and was patterned to form a gate electrode 129.

Figure 10D:
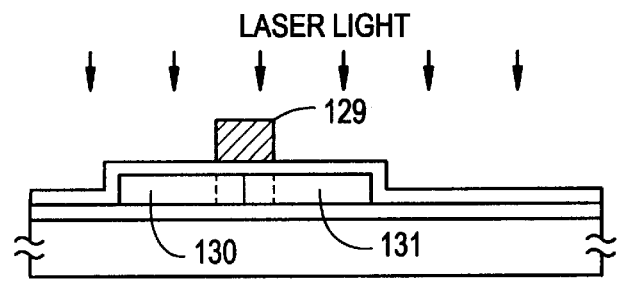

Subsequently, an impurity for rendering the active region P-conductive was incorporated in a self-aligned manner by ion doping into the active region using the gate electrode 129 as a mask. Diborane ($B_2H_6$) was used as the doping gas. Accordingly, the accelerating voltage was set in the range of from 40 to 80 kV, for example, at 65 kV, to introduce boron at a dose of from $1\times10^{15}$ to $8\times10^{15}$ cm$^{-2}$, for example, $5\times10^{14}$ cm$^{-2}$. Thus, P-type impurity regions 130 and 131 were obtained. Annealing using KrF excimer laser radiation (having a wavelength of 248 nm and a pulse width of 20 nsec) was effected thereafter. The conditions were the same as those of Example 1 (FIG. 10D).

Figure 10E:
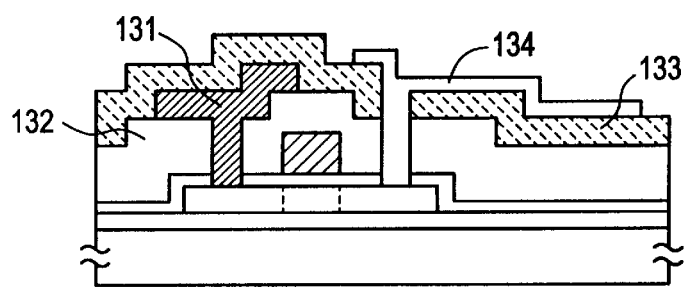

A 6,000 Å thick silicon oxide film 132 was deposited thereafter as an interlayer dielectric by plasma CVD, and contact holes were perforated to form electrode with wiring 131 in the P-type impurity region 130 using a metallic material, for instance, a multilayered film of titanium nitride and aluminum. A silicon nitride film 133 as a passivation film was formed thereafter by plasma CVD at a thickness of from 2,000 to 5,000 Å, for example, at a thickness of 3,000 Å. The resulting passivation film and the silicon oxide film 132 were etched to form a contact hole in the impurity region 131. Finally, a clear electrically conductive material i.e., ITO (indium tin oxide) was formed by sputtering, and etched to provide a pixel electrode 134 (FIG. 10E).

Thus was obtained a pixel transistor for an active matrix circuit. An active matrix circuit can be readily obtained by arranging a plurality of the elements above in a matrix. In the present example, a KrF excimer laser was used, but the type of the laser is not limited thereto, and other types of laser can be used as well.

While various examples have been described, it is to be understood that the scope of the present invention should not be limited to the particular examples of the invention. Many modifications may be made without departing the scope of the appended claims. For example, only silicon has been taught as the semiconductor material for forming semiconductor devices. However, it is not necessary to limit the present invention to this material. Also, while the present invention is directed to semiconductor devices formed on an insulating substrate such as glass, the concept of the present invention is applicable to a manufacture of a thin film semiconductor device formed on a semiconductor substrate such as a monolithic IC.

What is claimed is:

1. A method for manufacturing a semiconductor device comprising the steps of:

forming an island-like semiconductor film comprising silicon over a substrate;

forming a gate insulating film comprising silicon oxide adjacent to said island-like semiconductor film by a plasma CVD method using a starting gas comprising tetraethoxysilane and a gas selected from oxygen, ozone and nitrogen oxide; and forming a gate electrode adjacent to said gate insulating film.

2. A method according to claim 1 further comprising a step of heating said island-like semiconductor film.

3. A method according to claim 1 wherein said starting gas further comprises trichloroethylene.

4. A method according to claim 1 wherein a temperature of said substrate becomes 300 to 550° C. in forming said gate insulating film.

5. A method according to claim 1 wherein said gate electrode comprises one of a multilayered film of silicon and molybdenum, a multilayered film of silicon and molybdenum silicide, a multilayered film of silicon and titanium, a multilayered film of silicon and titanium silicide, a multilayered film of silicon and tungsten and a multilayered film of silicon and tungsten silicide.

6. A method according to claim 1 wherein said semiconductor device is selected from a liquid crystal device, an image sensor and an integrated circuit.

7. A method for manufacturing a semiconductor device comprising the steps of:

forming a base film comprising silicon oxide over a substrate by a plasma CVD method using a starting gas comprising tetraethoxysilane and a gas selected from oxygen, ozone and nitrogen oxide;

forming an island-like semiconductor film comprising silicon on said base film; and forming a gate electrode over said island-like semiconductor film.

8. A method according to claim 7 further comprising a step of heating said island-like semiconductor film.

9. A method according to claim 7 wherein said starting gas further comprises trichloroethylene.

10. A method according to claim 8 wherein said gate electrode comprises one of a multilayered film of silicon and molybdenum, a multilayered film of silicon and molybdenum silicide, a multilayered film of silicon and titanium, a multilayered film of silicon and titanium silicide, a multilayered film of silicon and tungsten and a multilayered film of silicon and tungsten silicide.

11. A method according to claim 7 wherein said semiconductor device is selected from a liquid crystal display device, an image sensor and an integrated circuit.

12. A method for manufacturing a semiconductor device comprising the steps of:

forming a base film comprising silicon oxide over a substrate by a plasma CVD method using a starting gas comprising tetraethoxysilane and a gas selected from oxygen, ozone and nitrogen oxide;

forming an island-like semiconductor film comprising silicon on said base film;

forming a gate insulating film comprising silicon oxide on said island-like semiconductor film by said plasma CVD method using said starting gas; and forming a gate electrode on said gate insulating film.

13. A method according to claim 12 further comprising a step of heating said island-like semiconductor film.

14. A method according to claim 12 wherein said starting gas further comprises trichloroethylene.

15. A method according to claim 12 wherein a temperature of said substrate becomes 300 to 550° C. in forming said gate insulating film.

16. A method according to claim 12 wherein said gate electrode comprises one of a multilayered film of silicon and molybdenum, a multilayered film of silicon and molybdenum silicide, a multilayered film of silicon and titanium, a multilayered film of silicon and titanium silicide, a multilayered film of silicon and tungsten and a multilayered film of silicon and tungsten silicide.

17. A method according to claim 12 wherein said semiconductor device is selected from a liquid crystal display device, an image sensor and an integrated circuit.

18. A method for manufacturing a semiconductor device, said method comprising the steps of:

forming a semiconductor island comprising silicon over a substrate;

forming a gate insulating film comprising silicon oxide adjacent to the semiconductor island by a plasma CVD method using a starting gas comprising tetraethoxysilane and a gas selected from oxygen, ozone and nitrogen oxide;

forming a gate electrode adjacent to the gate insulating film, forming an interlayer insulating film over the semiconductor island, the gate insulating film and the gate electrode, said interlayer insulating film comprising polyimide.

19. A method according to claim 18, wherein the starting gas further comprises trichloroethylene.

20. A method according to claim 18, wherein the semiconductor device is one selected from the group consisting of a liquid crystal display device, an image sensor and an integrated circuit.

21. A method for manufacturing a semiconductor device, said method comprising the steps of:

forming a base film comprising silicon oxide over a substrate by a plasma CVD method using a starting gas comprising tetraethoxysilane and a gas selected from oxygen, ozone and nitrogen oxide;

forming a semiconductor island comprising silicon on the base film;

forming a gate electrode over the semiconductor island;

forming an interlayer insulating film over the semiconductor island and the gate electrode, said interlayer insulating film comprising polyimide.

22. A method according to claim 21, wherein the starting gas further comprises trichloroethylene.

23. A method according to claim 21, wherein the semiconductor device is one selected from the group consisting of a liquid crystal display device, an image sensor and an integrated circuit.

24. A method for manufacturing a semiconductor device including at least a complementary circuit having an n-channel TFT and a p-channel TFT, said method comprising the steps of:

forming a semiconductor island comprising silicon over a substrate;

forming a gate insulating film comprising silicon oxide adjacent to the semiconductor island by a plasma CVD method using a starting gas comprising tetraethoxysilane and a gas selected from oxygen, ozone and nitrogen oxide;

forming a first gate electrode of the n-channel TFT and a second gate electrode of the p-channel TFT each adjacent to the gate insulating film;

introducing an n-type impurity into the semiconductor island to form n-type impurity regions of the n-channel TFT;

introducing a p-type impurity into the semiconductor island to form p-type impurity regions of the p-channel TFT.

25. A method according to claim 24, wherein the starting gas further comprises trichloroethylene.

26. A method according to claim 24, wherein the semiconductor device is one selected from the group consisting of a liquid crystal display device, an image sensor and an integrated circuit.

27. A method for manufacturing a semiconductor device including at least a complementary circuit having an n-channel TFT and a p-channel TFT, said method comprising the steps of:

forming a base film comprising silicon oxide over a substrate by a plasma CVD method using a starting gas comprising tetraethoxysilane and a gas selected from oxygen, ozone and nitrogen oxide;

forming a semiconductor island comprising silicon on the base film;

forming a first gate electrode of the n-channel TFT and a second gate electrode of the p-channel TFT each over the semiconductor island;

introducing an n-type impurity into the semiconductor island to form n-type impurity regions of the n-channel TFT;

introducing a p-type impurity into the semiconductor island to form p-type impurity regions of the p-channel TFT.

28. A method according to claim 27, wherein the starting gas further comprises trichloroethylene.

29. A method according to claim 27, wherein the semiconductor device is one selected from the group consisting of a liquid crystal display device, an image sensor and an integrated circuit.

* * * * *